United States Patent
Samura et al.

(10) Patent No.: US 12,374,520 B2
(45) Date of Patent: Jul. 29, 2025

(54) TWEEZERS, CONVEYANCE DEVICE, AND METHOD FOR CONVEYING SAMPLE PIECE

(71) Applicant: Hitachi High-Tech Corporation, Tokyo (JP)

(72) Inventors: Naoki Samura, Tokyo (JP); Tsunenori Nomaguchi, Tokyo (JP); Shinsuke Kawanishi, Tokyo (JP); Yaku Maeda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 475 days.

(21) Appl. No.: 17/922,204

(22) PCT Filed: May 1, 2020

(86) PCT No.: PCT/JP2020/018422
§ 371 (c)(1),
(2) Date: Oct. 28, 2022

(87) PCT Pub. No.: WO2021/220508
PCT Pub. Date: Nov. 4, 2021

(65) Prior Publication Data
US 2023/0268156 A1    Aug. 24, 2023

(51) Int. Cl.
*H01J 37/20* (2006.01)
*H01J 37/244* (2006.01)
*H01J 37/30* (2006.01)

(52) U.S. Cl.
CPC ............ *H01J 37/20* (2013.01); *H01J 37/244* (2013.01); *H01J 37/3005* (2013.01);
(Continued)

(58) Field of Classification Search
CPC ...... H01J 37/20; H01J 37/244; H01J 37/3005; H01J 2237/2007; H01J 2237/208;
(Continued)

(56) References Cited

U.S. PATENT DOCUMENTS

| 6,538,254 B1 | 3/2003 | Tomimatsu et al. |
| 7,227,140 B2 | 6/2007 | Skidmore et al. |

(Continued)

FOREIGN PATENT DOCUMENTS

| CN | 205514976 U | 8/2016 |
| CN | 206399720 U | 8/2017 |

(Continued)

OTHER PUBLICATIONS

International Search Report (PCT/ISA/210) issued in PCT Application No. PCT/JP2020/018422 dated Jul. 28, 2020 with English translation (five (5) pages).
(Continued)

*Primary Examiner* — David A Vanore
(74) *Attorney, Agent, or Firm* — Crowell & Moring LLP

(57) ABSTRACT

Tweezers 8, which can grip a sample piece 9, includes a gripping member 8a1 and a gripping member 8a2. The gripping member 8a1 includes a gripping region 8c1 and an abutment region 8b1, and the gripping member 8a2 includes a gripping region 8c2 and an abutment region 8b2. The gripping region 8c1 and the gripping region 8c2 include a gripping surface SF1 and a gripping surface SF2 for gripping the sample piece 9, respectively. The abutment region 8b1 protrudes from the gripping region 8c1 in a direction directed from the gripping surface SF1 to the gripping surface SF2, and the abutment region 8b2 protrudes from the gripping region 8c2 in a direction directed from the gripping surface SF2 to the gripping surface SF1.

14 Claims, 16 Drawing Sheets

(52) U.S. Cl.
CPC . *H01J 2237/2007* (2013.01); *H01J 2237/208* (2013.01); *H01J 2237/31749* (2013.01)

(58) Field of Classification Search
CPC ... H01J 2237/31749; H01J 2237/31745; H01J 37/317; G01N 2001/2873; G01N 1/28
See application file for complete search history.

(56) References Cited

U.S. PATENT DOCUMENTS

| | | | | |
|---|---|---|---|---|
| 2002/0194938 | A1* | 12/2002 | Koo | H01J 37/20 73/864.91 |
| 2003/0198755 | A1 | 10/2003 | Shichi et al. | |
| 2004/0178372 | A1* | 9/2004 | Rasmussen | H01J 37/20 250/559.22 |
| 2005/0178980 | A1 | 8/2005 | Skidmore et al. | |
| 2005/0247886 | A1* | 11/2005 | Wang | H01J 37/3056 250/442.11 |
| 2006/0219919 | A1* | 10/2006 | Moore | H01J 37/26 250/311 |
| 2007/0272854 | A1* | 11/2007 | Agorio | G02B 21/32 250/307 |
| 2010/0213386 | A1* | 8/2010 | Man | G01N 1/32 250/400 |
| 2019/0157037 | A1* | 5/2019 | Tomimatsu | H01J 37/20 |
| 2023/0268156 | A1* | 8/2023 | Samura | H01J 37/20 250/310 |
| 2024/0047172 | A1* | 2/2024 | Verwimp | H01J 37/20 |

FOREIGN PATENT DOCUMENTS

| | | |
|---|---|---|
| CN | 206548598 U | 10/2017 |
| JP | 2003-311435 A | 11/2003 |
| JP | 2006-120391 A | 5/2006 |
| JP | 2007-506981 A | 3/2007 |
| JP | 2009-210330 A | 9/2009 |
| JP | 2009-216498 A | 9/2009 |
| JP | 2009-216534 A | 9/2009 |
| JP | 2010-190808 A | 9/2010 |
| WO | WO 99/05506 A1 | 2/1999 |

OTHER PUBLICATIONS

Japanese-language Written Opinion (PCT/ISA/237) issued in PCT Application No. PCT/JP2020/018422 dated Jul. 28, 2020 (five (5) pages).

Taiwanese-language Office Action issued in Taiwanese Application No. 110108688 dated Nov. 29, 2021 (six (6) pages).

Japanese-language International Preliminary Report on Patentability (PCT/IPEA/416 & PCT/IPEA/409) issued in PCT Application No. PCT/JP2020/018422 dated Jun. 22, 2021, including Annexes (17 pages).

\* cited by examiner

[FIG. 1]
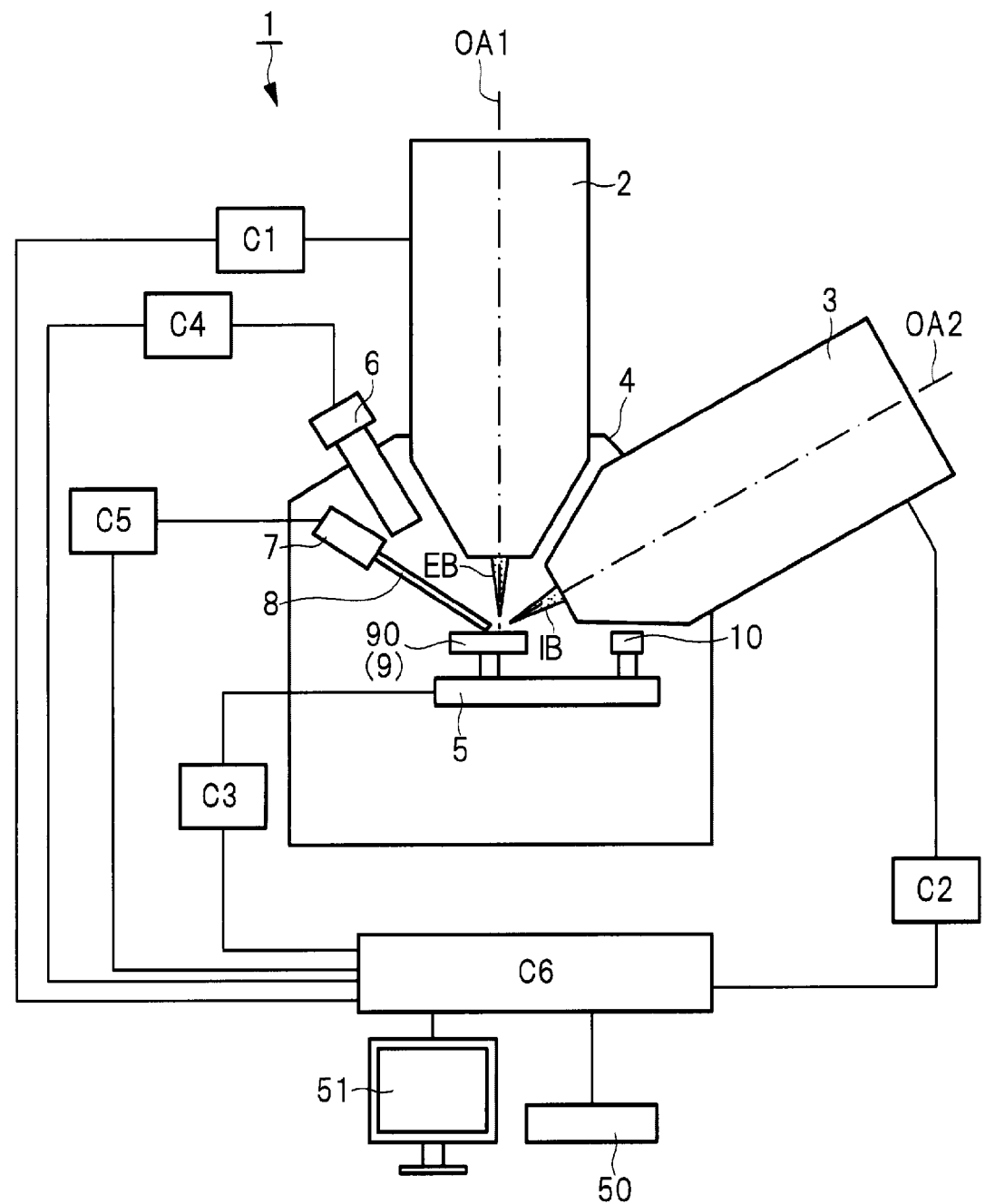

[FIG. 2]
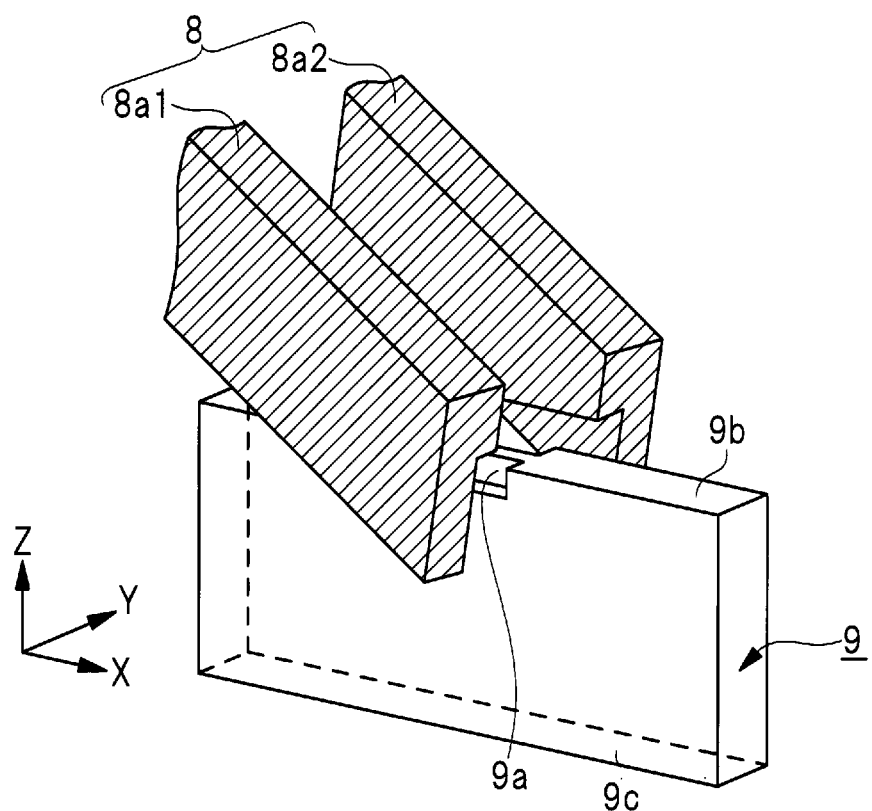

[FIG. 3]
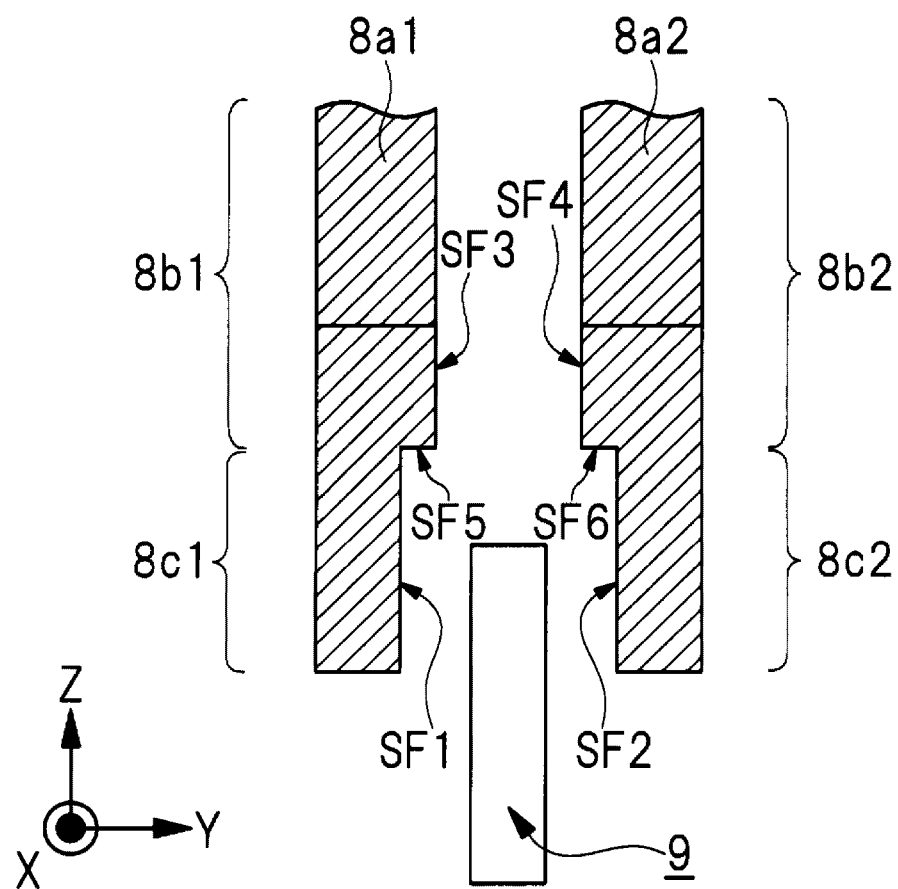

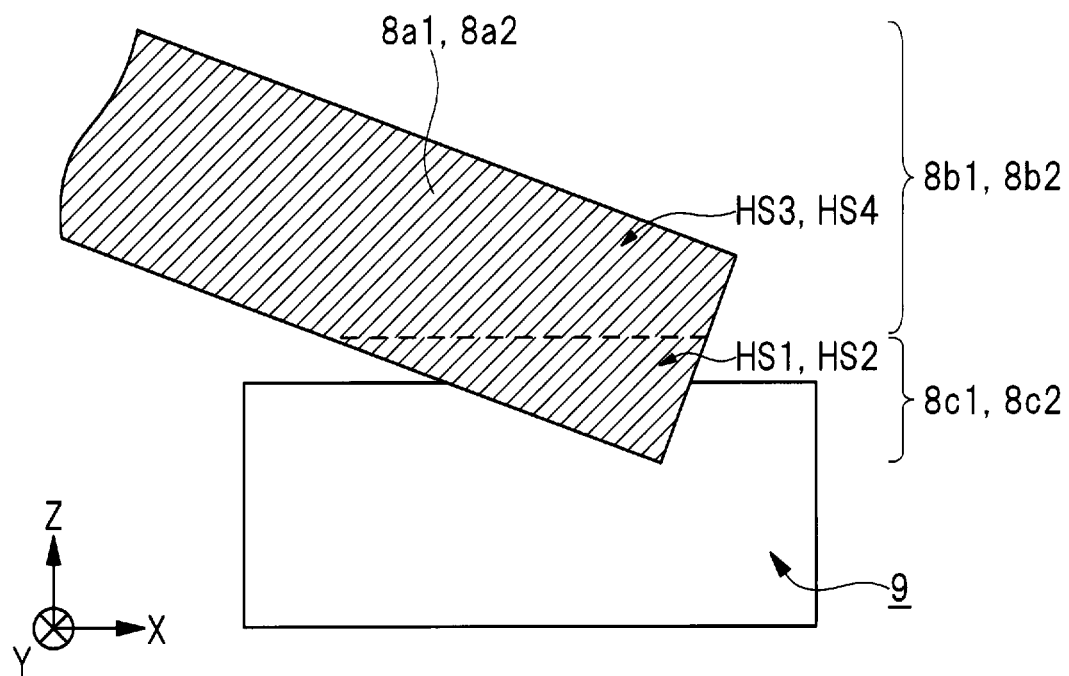
[FIG. 4]

[FIG. 5]
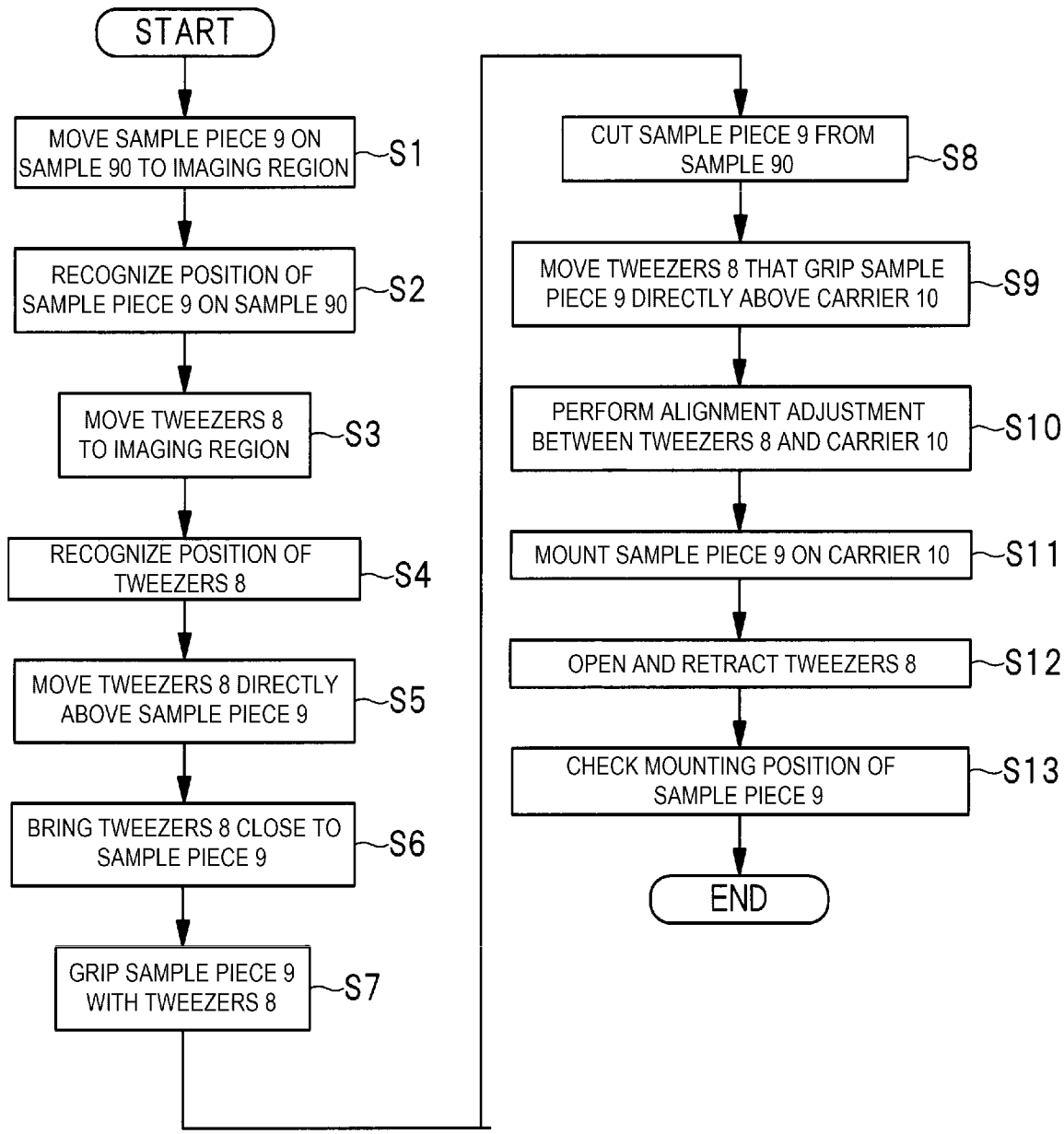

[FIG. 6]
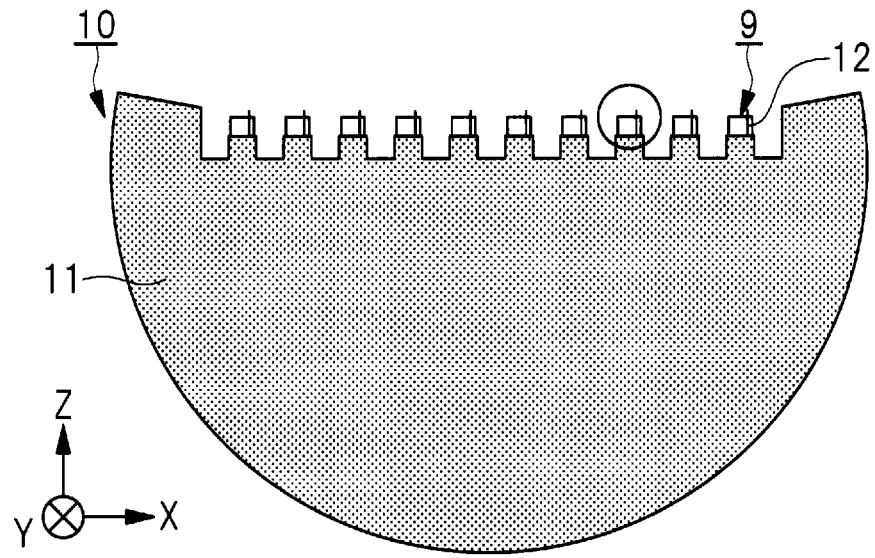
[FIG. 7]
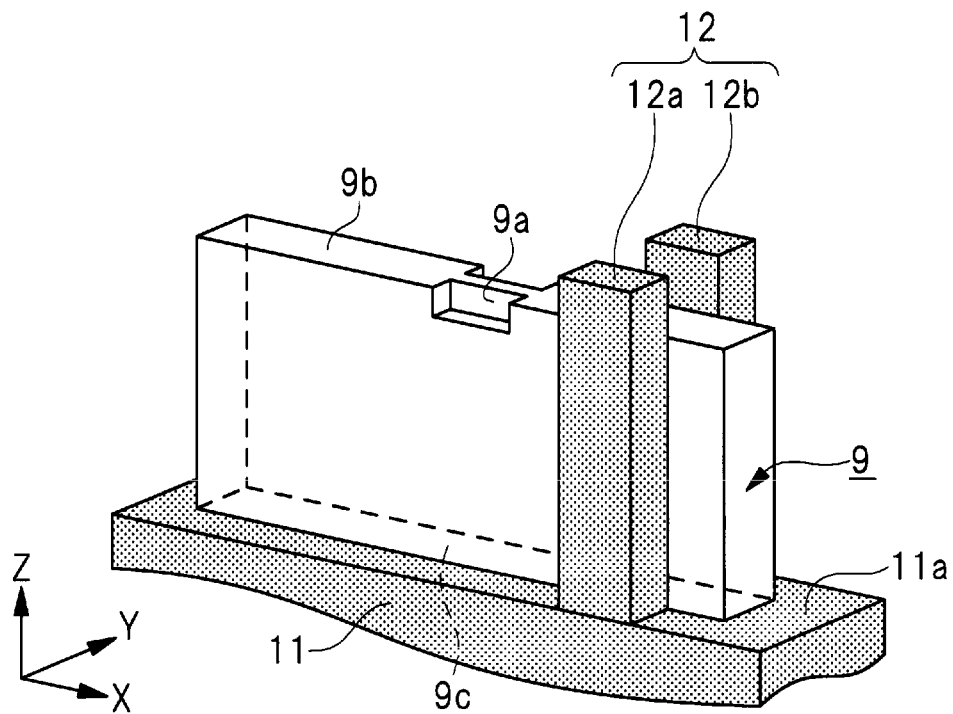

[FIG. 8]
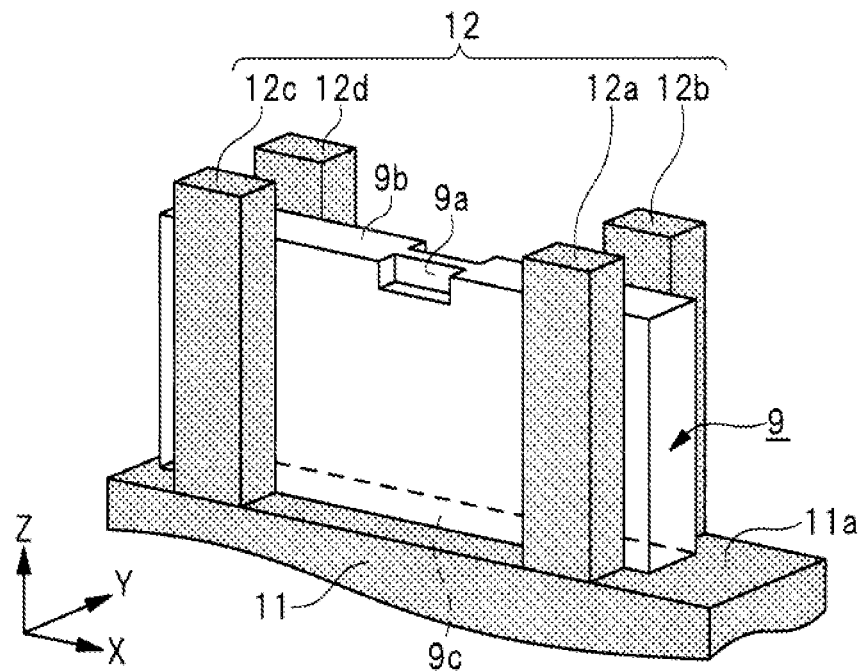
[FIG. 9]
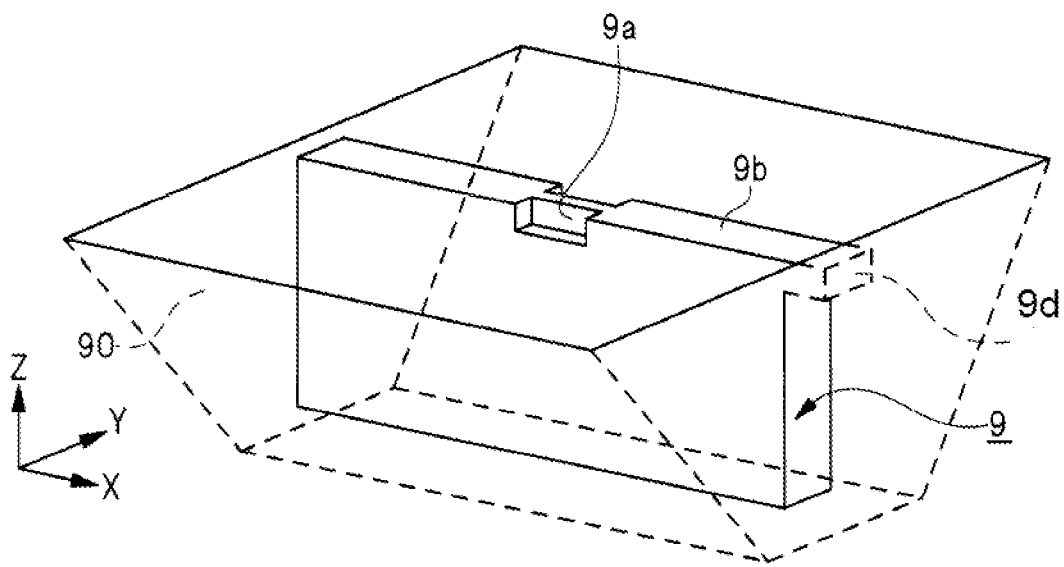

[FIG. 10]
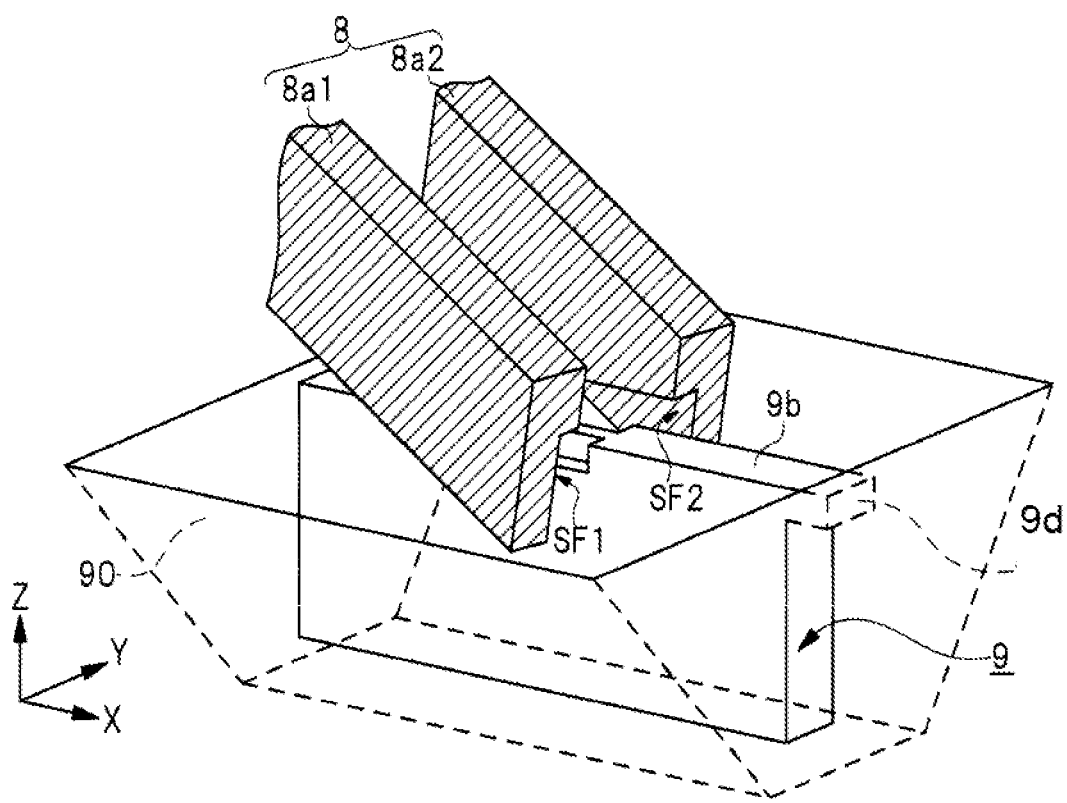

[FIG. 11]
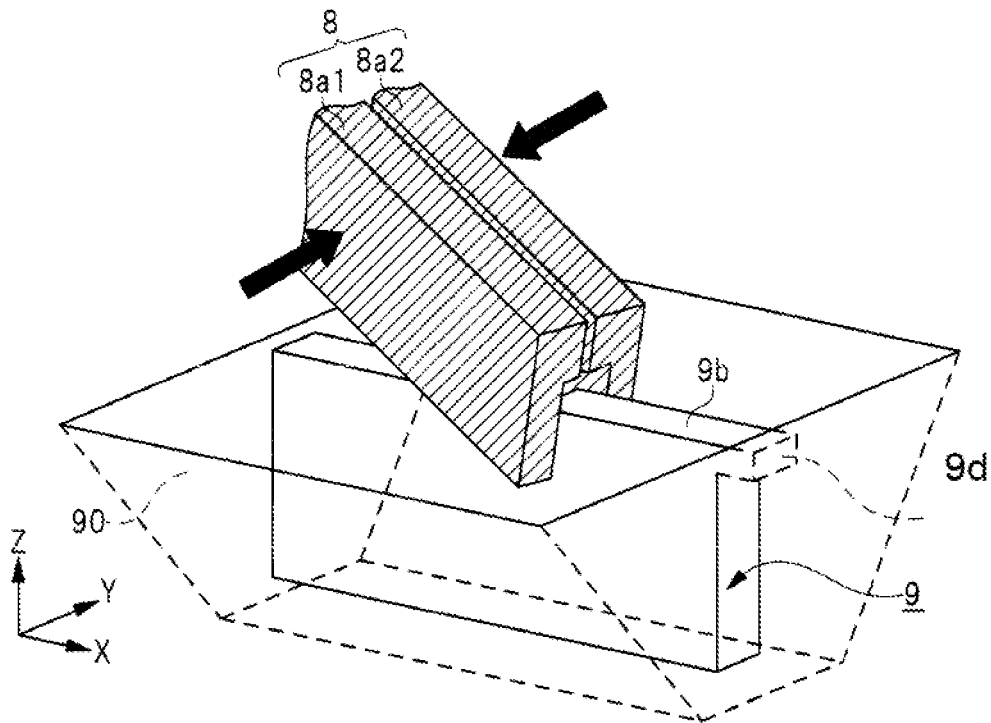
[FIG. 12]
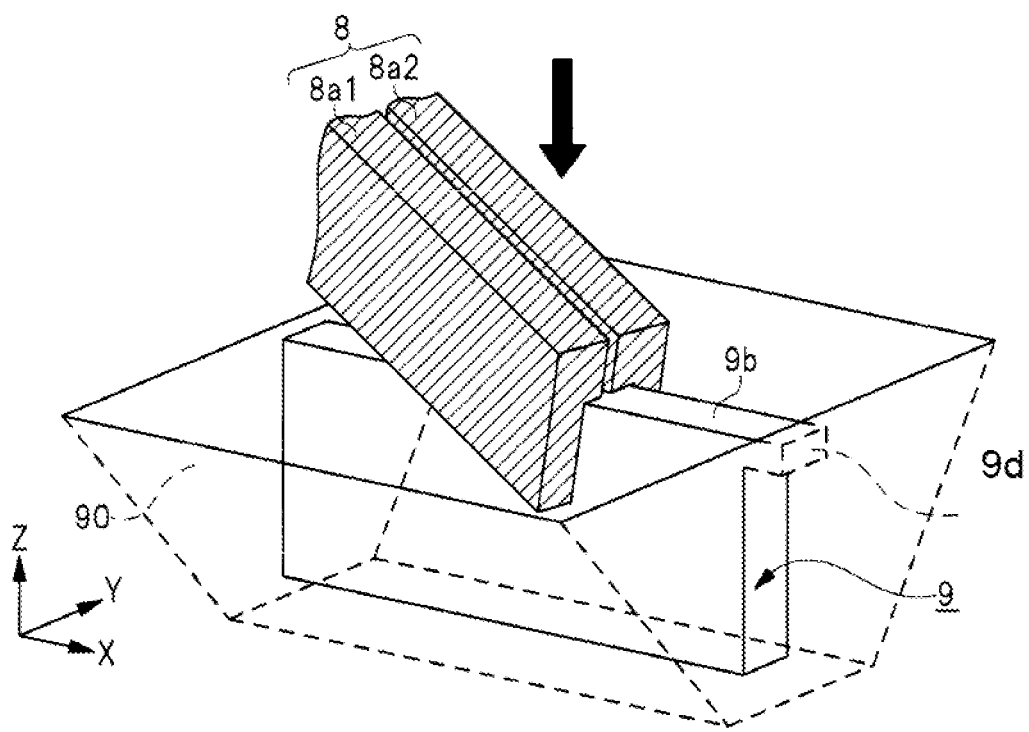

[FIG. 13]
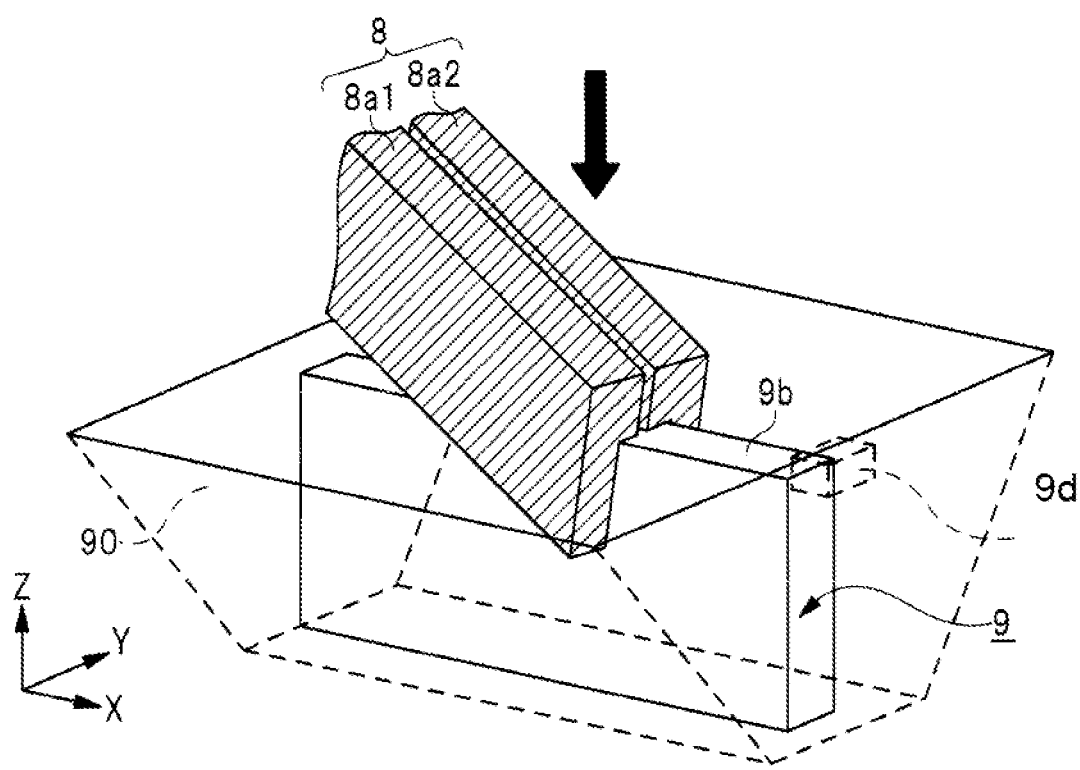

[FIG. 14]
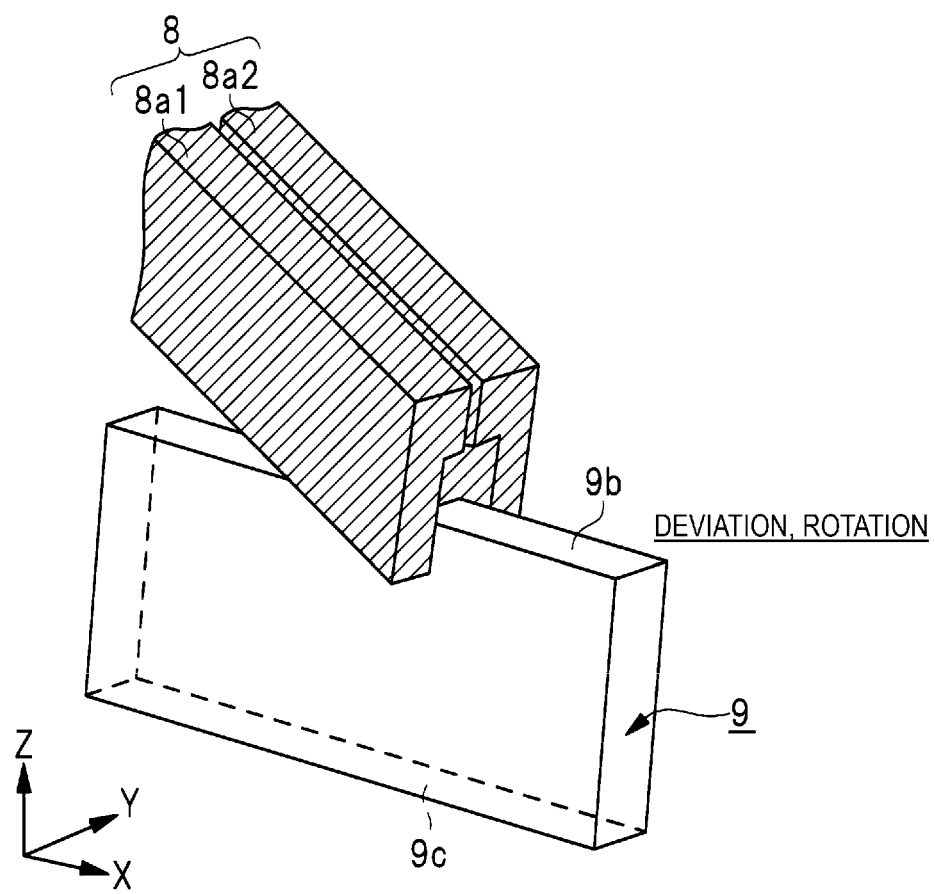

[FIG. 15]
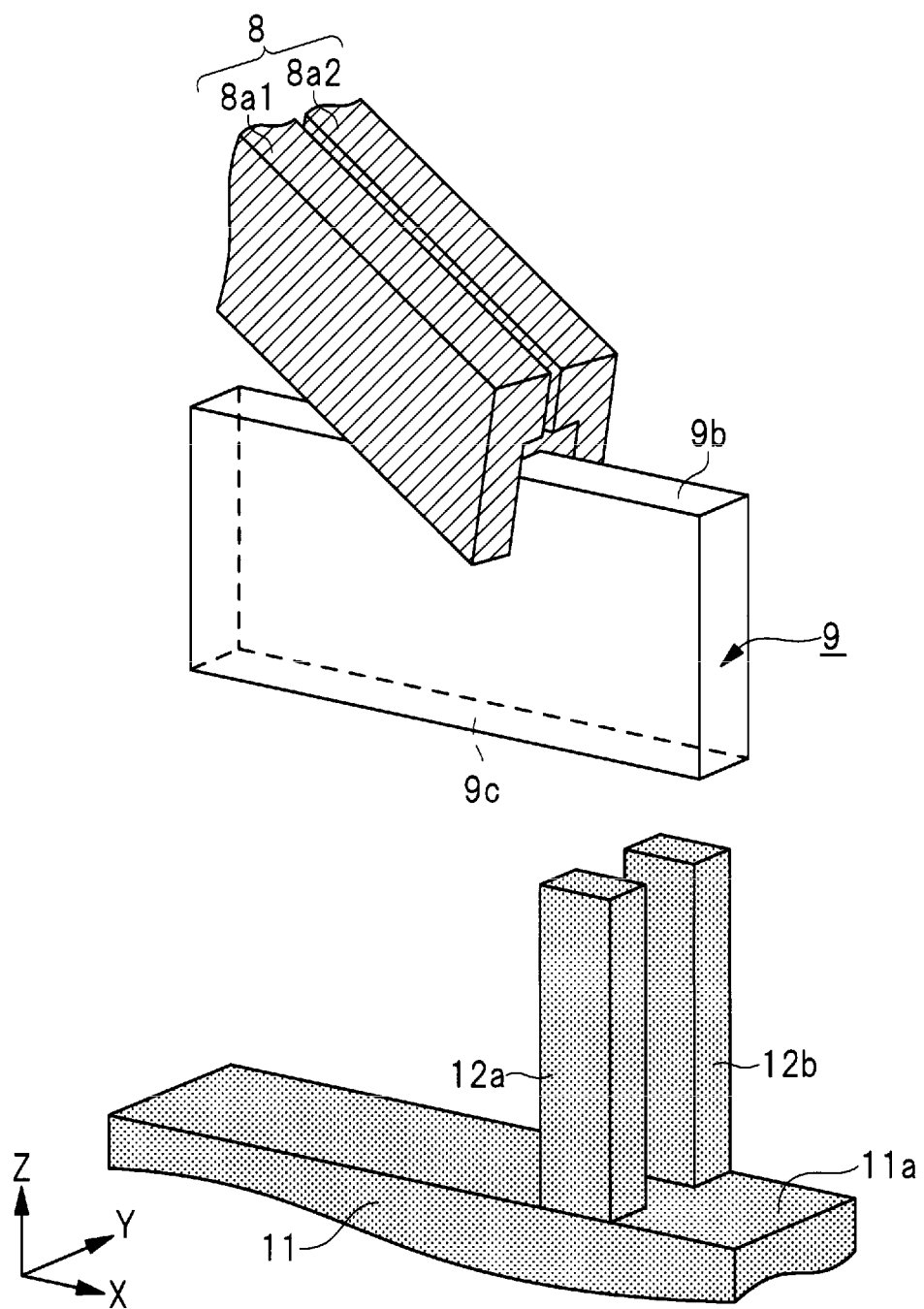

[FIG. 16]
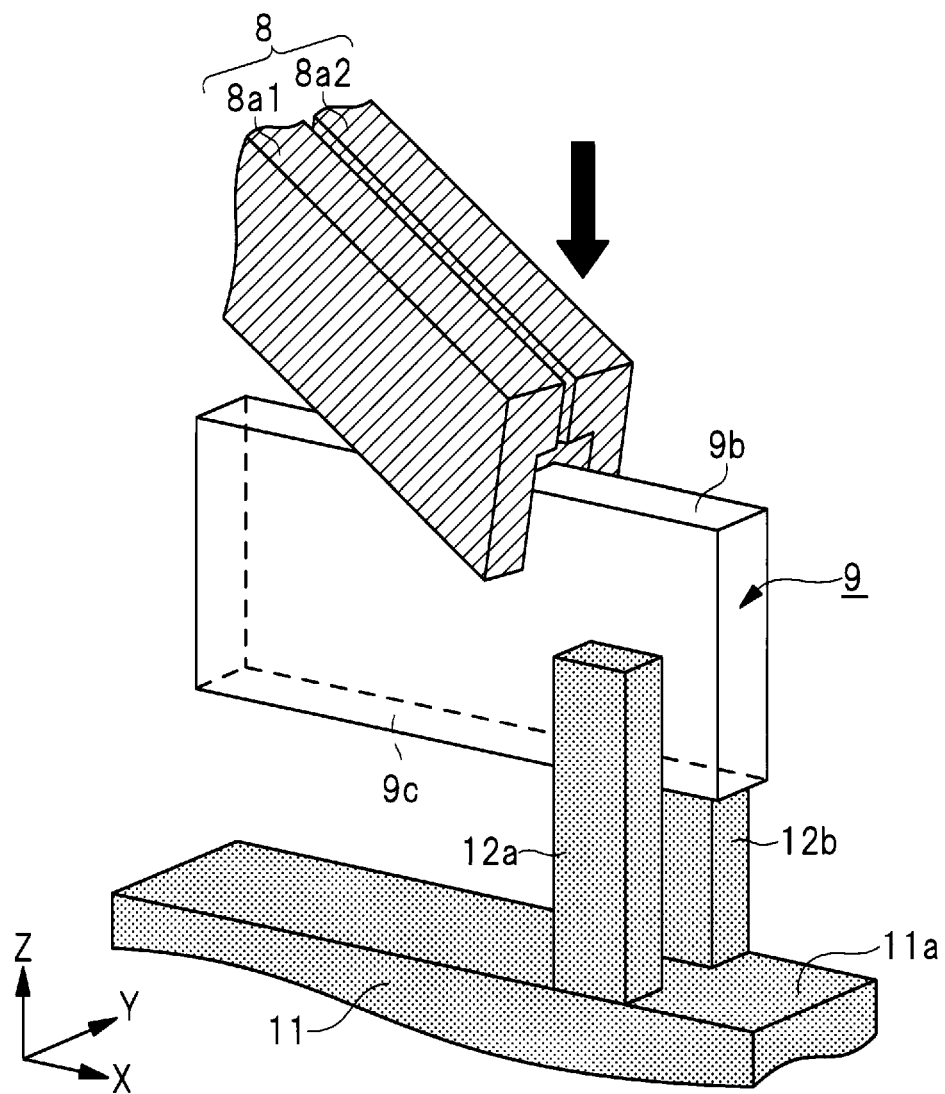

[FIG. 17]
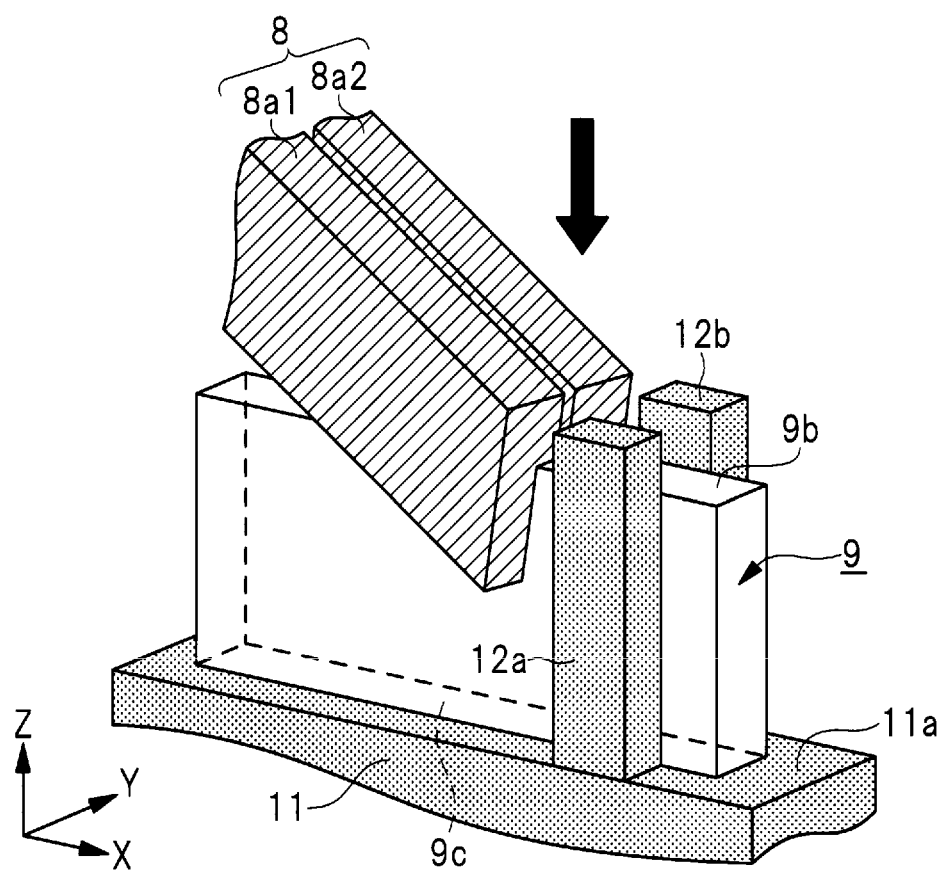

[FIG. 18]
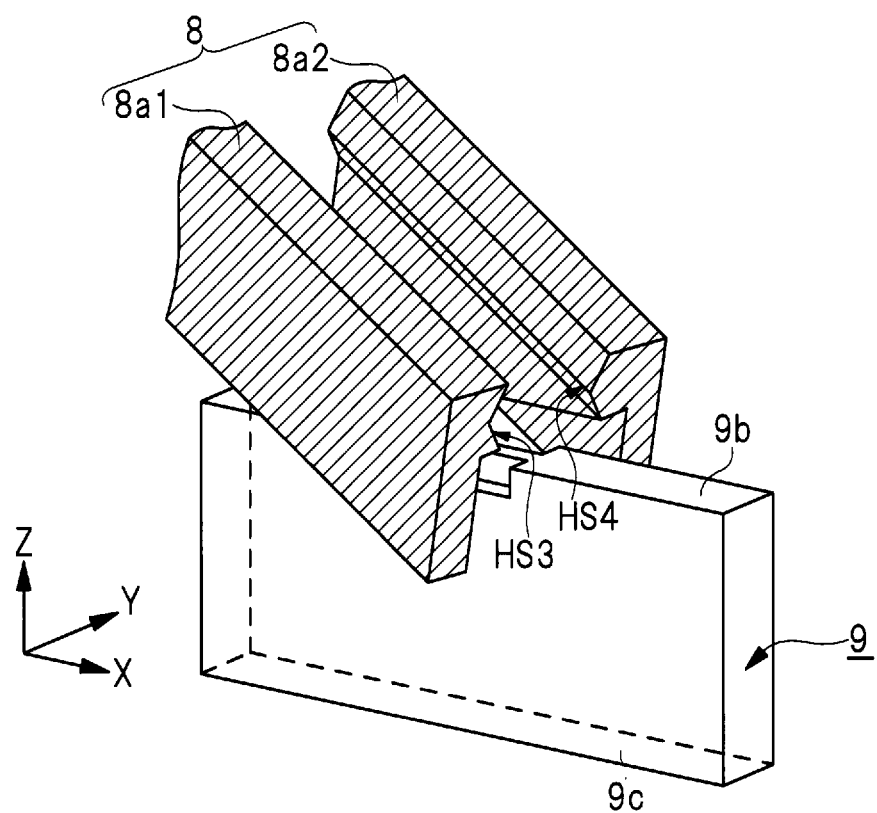

[FIG. 19]
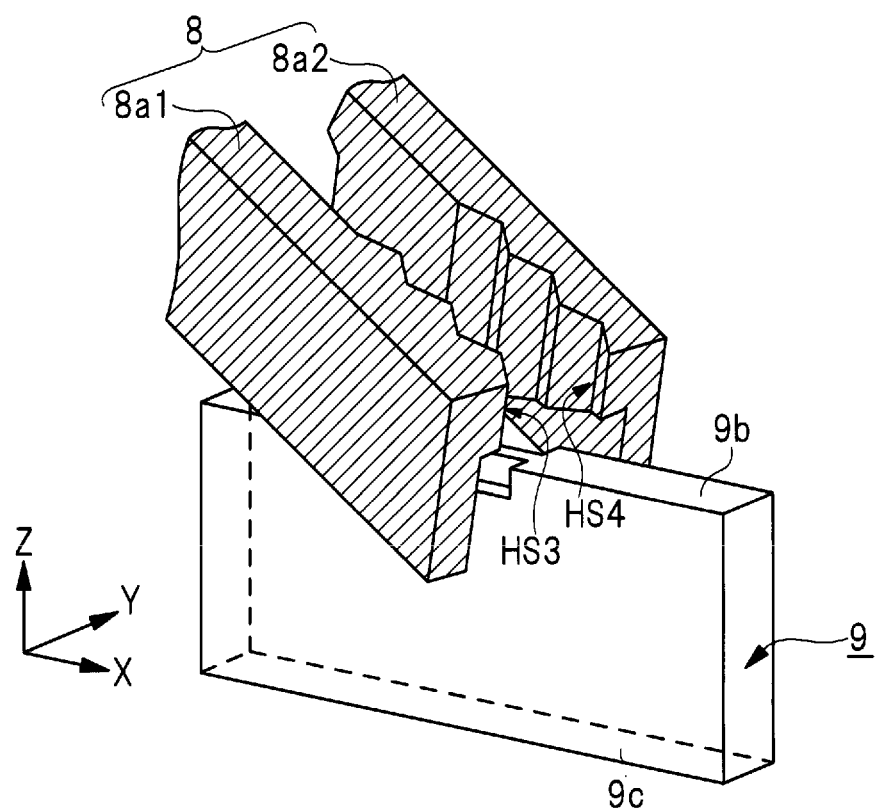

TWEEZERS, CONVEYANCE DEVICE, AND METHOD FOR CONVEYING SAMPLE PIECE

TECHNICAL FIELD

The present invention relates to tweezers, a conveyance device, and a method for conveying a sample piece, and can be particularly suitably used for tweezers for gripping a sample, a conveyance device including the tweezers, and a method for conveying a sample piece by using the tweezers.

BACKGROUND ART

In recent years, with miniaturization and high integration of semiconductor devices, their internal structures have become complicated. Therefore, during a defect analysis of a semiconductor device, a high spatial resolution is required, and importance of an analysis method of a cross-sectional structure at the high spatial resolution is increased. Further, by rapidly performing the defect analysis, it is possible to greatly contribute to improvement in yield without lowering productivity in a manufacturing step of the semiconductor device.

Since an analysis using a related-art optical microscope or scanning electron microscope (SEM) is sensitive to a surface state of a sample, it is difficult to obtain an internal structure of the sample. Therefore, it is necessary to take out a sample piece having a cross section to be observed from the sample and observe the sample piece.

Currently, in order to analyze a cross-sectional structure of a sample, a sample piece production method using a focused ion beam (FIB) device is widely used. Further, in order to obtain a spatial resolution higher than those of the optical microscope and the SEM in an analysis of a fine cross-sectional structure of a semiconductor device or the like, a transmission electron microscope (TEM) is used. A sample piece produced by the FIB device is conveyed to a carrier, and the sample piece mounted on the carrier is analyzed using the TEM.

For example, PTL 1 discloses a production method and a conveyance method of a sample piece by using a deposition function of an FIB device. In this method, during production of the sample piece, the sample piece is taken out by bonding a probe to the sample piece by the deposition function, and the deposition function is also used for fixing the sample piece to a carrier.

PTLs 2 and 3 disclose a method for conveying a sample piece to a carrier by using tweezers. In the method disclosed in PTL 2, a sample piece is produced from a sample by using an FIB device, the sample piece is taken out from the sample by using tweezers, and the sample piece gripped by the tweezers is mounted on a carrier. Further, PTL 3 proposes a method for forming a convex portion on an upper surface of a sample piece in order to prevent an influence of sliding when mounting the sample piece on a carrier.

CITATION LIST

Patent Literature

PTL 1: WO 1999/05506
PTL 2: JP-A-2009-216498
PTL 3: JP-A-2009-216534

SUMMARY OF INVENTION

Technical Problem

In the method disclosed in PTL 1, since it is necessary to perform deposition by the FIB device during the production of the sample piece, there is a problem that a production time of the sample piece is inevitably long. Further, contamination of the sample piece may also become a problem in the deposition step.

In the method disclosed in PTL 2, when the sample piece is taken out and the sample piece is mounted on the carrier, an external force in a direction parallel to a gripping surface of the tweezers may be applied to the sample piece and the tweezers. Accordingly, there is a problem that a gripping state of the sample piece changes, or a problem that the sample piece rotates and a gripping position of the sample piece changes. Further, in some cases, when tip end portions of the tweezers intersect with each other, the sample piece may be flicked and lost.

In the method disclosed in PTL 3, influences of the problems described above can be reduced. However, since the convex portion of the sample piece is grasped by the tip end portions of the tweezers, rotation of the sample piece cannot be prevented by an installation angle of the tweezers. Further, since an additional sputtering step is necessary for each production of the sample piece, there is a problem that a throughput in an entire analysis step of the sample piece including the production step and the conveyance step of the sample piece increases. Furthermore, since the convex portion needs to be provided on the upper surface of the sample piece, a decrease in a strength of the sample piece also becomes a problem during conveyance of the sample piece.

To summarize the above, development of tweezers having high stability in gripping a sample piece is required, and a conveyance device including such tweezers is required. Further, a technique for improving the throughput in the entire analysis step of the sample piece by using the conveyance device is required.

Other problems and novel features will become apparent from the description of the present specification and the accompanying drawings.

Solution to Problem

An outline of a representative embodiment of the embodiments disclosed in the present application will be briefly described as follows.

Tweezers according to an embodiment include a first gripping member and a second gripping member, and are configured to grip a sample piece to be analyzed using a charged particle beam device. Here, the first gripping member includes a first gripping region and a first abutment region integrated with the first gripping region, the second gripping member includes a second gripping region and a second abutment region integrated with the second gripping region, the first gripping region includes a first surface for gripping the sample piece, the second gripping region includes a second surface that faces the first surface and is for gripping the sample piece, the first abutment region protrudes from the first gripping region in a direction directed from the first surface to the second surface, and the second abutment region protrudes from the second gripping region in a direction directed from the second surface to the first surface.

A method for conveying a sample piece according to an embodiment is performed using a conveyance device including a stage for placing a sample, tweezers including a first gripping member and a second gripping member, and a carrier for mounting the sample piece to be analyzed using a charged particle beam device. Further, the method for conveying the sample piece includes: (a) a step of placing the sample from which the sample piece is produced on a part of the stage; (b) a step of gripping the sample piece between the first gripping member and the second gripping member after the step (a); (c) a step of taking out the sample piece from the sample in a state where the sample piece is gripped by the tweezers after the step (b); and (d) a step of mounting the sample piece on the carrier in a state where the sample piece is gripped by the tweezers after the step (c). Here, during a period from a starting time of the step (c) to an ending time of the step (d), a state of the sample piece gripped between the first gripping member and the second gripping member is changed from a first state to a second state.

Advantageous Effects of Invention

According to an embodiment, tweezers having high stability in gripping a sample piece can be provided, and a conveyance device including such tweezers can be provided. Further, a throughput in an entire analysis step of the sample piece can be improved.

BRIEF DESCRIPTION OF DRAWINGS

FIG. 1 is a schematic diagram showing a conveyance device according to a first embodiment.

FIG. 2 is a perspective view showing tweezers and a sample piece according to the first embodiment.

FIG. 3 is a front view showing the tweezers and the sample piece according to the first embodiment.

FIG. 4 is a side view showing the tweezers and the sample piece according to the first embodiment.

FIG. 5 is a flowchart showing a method for conveying the sample piece according to the first embodiment.

FIG. 6 is a front view showing a carrier to which the sample piece according to the first embodiment is conveyed.

FIG. 7 is a perspective view showing an example of the carrier to which the sample piece according to the first embodiment is conveyed.

FIG. 8 is a perspective view showing another example of the carrier to which the sample piece according to the first embodiment is conveyed.

FIG. 9 is a perspective view showing a sample from which the sample piece according to the first embodiment is produced.

FIG. 10 is a perspective view showing the method for conveying the sample piece according to the first embodiment.

FIG. 11 is a perspective view showing the method for conveying the sample piece following FIG. 10.

FIG. 12 is a perspective view showing the method for conveying the sample piece following FIG. 11.

FIG. 13 is a perspective view showing the method for conveying the sample piece following FIG. 12.

FIG. 14 is a perspective view showing the method for conveying the sample piece following FIG. 13.

FIG. 15 is a perspective view showing a state where the sample piece deviates and a state where the sample piece rotates.

FIG. 16 is a perspective view showing the method for conveying the sample piece following FIGS. 11 to 14.

FIG. 17 is a perspective view showing the method for conveying the sample piece following FIG. 15.

FIG. 18 is a perspective view showing tweezers according to a first modification.

FIG. 19 is a perspective view showing tweezers according to a second modification.

DESCRIPTION OF EMBODIMENTS

Hereinafter, an embodiment will be described in detail with reference to the drawings. In all the drawings for illustrating the embodiment, members having the same function are denoted by the same reference numerals, and repeated description thereof is omitted. Further, in the following embodiment, description of the same or similar parts will not be repeated in principle unless particularly necessary.

An X direction, a Y direction, and a Z direction described in the present application are orthogonal to one another. In the present application, the Z direction may be described as an upper-lower direction, a height direction, or a thickness direction of a certain structure.

First Embodiment

<Configuration of Conveyance Device 1>

Hereinafter, a conveyance device 1 according to a first embodiment will be described with reference to FIG. 1.

The conveyance device 1 includes a sample chamber 4 and control units C0 to C5. The sample chamber 4 includes an electron beam column 2 that can emit an electron beam EB, an ion beam column 3 that can emit an ion beam IB, a stage 5 for placing a sample 90, a detector 6, tweezers 8 that can hold a sample piece 9, a manipulator 7 connected to the tweezers 8, and a carrier 10 for mounting the sample piece 9. Further, an input device 50 and a display 51 are provided inside or outside the conveyance device 1.

The electron beam column 2 includes all components necessary as a SEM device, such as an electron source for generating an electron beam (charged particle beam) EB, a lens for focusing the electron beam EB, and a deflection system for scanning with and shifting the electron beam EB.

An electron beam column control unit C1 controls the electron beam column 2. For example, emission of the electron beam EB from the electron source, driving of the deflection system, and the like are controlled by the electron beam column control unit C1.

The ion beam column 3 includes all components necessary as an FIB device, such as an ion source for generating an ion beam (charged particle beam) IB, a lens for focusing the ion beam IB, and a deflection system for scanning with and shifting the ion beam IB.

The ion beam column control unit C2 controls the ion beam column 3. For example, generation of the ion beam IB from the ion source, the driving of the deflection system, and the like are controlled by the ion beam column control unit C2.

The electron beam EB that passes through the electron beam column 2 and the ion beam IB that passes through the ion beam column 3 are mainly focused on a cross point that is an intersection between an optical axis OA1 of the electron beam column 2 and an optical axis OA2 of the ion beam column 3. At the cross point, a state of the sample piece 9 to be observed and the tweezers 8 that grip the sample piece 9 can be observed.

In the first embodiment, the electron beam column 2 is perpendicularly disposed and the ion beam column 3 is obliquely disposed, but the present invention is not limited thereto. The ion beam column 3 may be obliquely disposed, and the electron beam column 2 may be perpendicularly disposed. Further, both the ion beam column 3 and the electron beam column 2 may be obliquely arranged.

The conveyance device 1 may include two electron beam columns 2 or two ion beam columns 3. Further, the conveyance device 1 may include only one electron beam column 2 or only one ion beam column 3.

The sample 90 and the carrier (grid, mesh) 10 can be placed on the stage 5. Driving of the stage 5 is controlled by the wafer stage control unit C3. Under control of the wafer stage control unit C3, the stage 5 can perform a planar movement, a perpendicular movement, a rotational movement, and an oblique movement. Positions and directions of the sample 90 and the carrier 10 can be freely changed by driving the stage 5.

The sample 90 according to the first embodiment is, for example, a wafer formed with a semiconductor device. The wafer is configured with a semiconductor substrate, a semiconductor element such as a transistor formed on the semiconductor substrate, a wiring layer formed on the semiconductor element, and the like. Since the sample piece 9 is a thin piece obtained from a part of the wafer, a structure of the sample piece 9 includes all or some of the semiconductor substrate, the semiconductor element, and the wiring layer.

The detector 6 can detect secondary electrons (charged particles) emitted from an observation target to which the electron beam EB or the ion beam IB is emitted. The detector 6 is a detector such as a secondary electron detector, a reflected electron detector, a STEM detector, a low energy loss electron detector, or an EDX detector. Here, the detector 6 detects secondary electrons emitted from the sample 90 or the sample piece 9.

The detector control unit C4 controls the detector 6. The detector control unit C4 includes an arithmetic processing unit that performs arithmetic processing on a detection signal from the detector 6 and images the detection signal.

The tweezers 8 can grip the sample piece 9 formed on the sample 90. The manipulator 7 is connected to a base portion of the tweezers 8. The manipulator 7 is connected to the tweezers control unit C5 that can control the manipulator 7. The manipulator 7 can perform an opening and closing operation, a planar movement, a perpendicular movement, and a rotational movement of the tweezers 8. That is, the operation and the movement of the tweezers 8 are performed by the manipulator 7 based on a control signal from the tweezers control unit C5. The manipulator 7 may be attached to the stage 5.

The comprehensive control unit C0 is electrically or physically connected to the electron beam column control unit C1, the ion beam column control unit C2, the stage control unit C3, the detector control unit C4, and the tweezers control unit C5, and controls these control units. Therefore, in the present application, it may be described that control performed by each of the control units C1 to C5 is performed by the comprehensive control unit C0. Further, the comprehensive control unit C0 including the control units C1 to C5 may be regarded as one control unit, and the comprehensive control unit C0 may be simply referred to as "control unit".

One computer may perform all control functions as the comprehensive control unit C0, but a plurality of computers may share any control function as the comprehensive control unit C0.

The input device 50 is, for example, a device for a user to input an instruction such as input of information to be analyzed, a change in emitting conditions of the electron beam EB and the ion beam IB, and a change in a position of the stage 5. The input device 50 is, for example, a keyboard or a mouse. When the user performs work on the display 51 by using the input device 50, various information is input to the comprehensive control unit C0 or output from the comprehensive control unit C0.

Various screens are displayed on the display 51 as user interfaces. For example, the user interface includes a screen for displaying and changing a control state of the conveyance device 1, a screen for displaying and changing the emitting conditions of the electron beam EB or the ion beam IB, a screen for displaying and changing an observation image, a screen for displaying and changing coordinates of the stage 5 and coordinates of the tweezers 8, or the like. The number of the displays 51 may be one or more. Further, the display 51 may have a function of the input device 50 like a touch panel.

The conveyance device 1 includes an imaging medium that can observe a gripping state of the sample piece 9 by the tweezers 8. The imaging medium according to the first embodiment includes the electron beam column 2 or the ion beam column 3, and the detector 6. In this case, a gripping state and a conveyance state of the sample piece 9 can be observed by only a SEM image by the electron beam column 2 or only a SIM image by the ion beam column 3. Further, other imaging media such as an optical microscope may be provided in the sample chamber 4.

In order to check an operation state of the tweezers 8, the manipulator 7 has such a stroke that the manipulator 7 can move within a field of view of the SEM image or the SIM image. Further, in order to make an image without the tweezers 8 also observable, the manipulator 7 can be retracted outside the field of view of the SEM image or the SIM image. In order to retract outside the field of view, a shielding structure for shielding the electron beam EB or the ion beam IB may be provided in the sample chamber 4, and the tweezers 8 may be retracted to the shielding structure by operating the manipulator 7. Accordingly, the electron beam EB from the electron beam column 2 or the ion beam IB from the ion beam column 3 can prevent the tweezers 8 from being influenced by contamination or sputtering.

In addition to the above description, the sample chamber 4 may be mounted with gas deposition units (not shown). Each gas deposition unit includes a control unit that controls driving thereof. The gas deposition unit is used for producing or marking a protective film on the sample 90, and stores a deposition gas for forming a deposited film. The deposition gas can be supplied from a nozzle tip end when necessary. Further, the sample chamber 4 may be mounted with a pressure-reducing device or the like for vacuum evacuation.

<Structure of Tweezers 8, and Structure of Sample Piece 9>

One main feature of the present application is a structure of the tweezers 8. Hereinafter, the structure of the sample piece 9 gripped by the tweezers 8 and the structure of the tweezers 8 will be described.

The sample piece 9 is a thin piece formed on a part of the sample 90. The sample piece 9 taken out from the sample 90 by the tweezers 8 and gripped by the tweezers 8 is mounted on the carrier 10. Thereafter, the detailed structure of the sample piece 9 is analyzed using an analysis device (charged particle beam device) such as a SEM, a STEM, or a TEM.

As shown in FIGS. 2 to 4, the sample piece 9 is a thin piece whose width in the Y direction is smaller than a width in the X direction and a width in the Z direction. The sample piece 9 includes a lower end portion (lower surface) 9c and an upper end portion (upper surface) 9b on a side opposite to the lower end portion 9c. When the sample piece 9 is mounted on the carrier 10, the lower end portion 9c is a location positioned closer to a placement surface of the carrier 10 than the upper end portion 9b.

An analysis portion 9a is provided on an upper end portion 9b side of the sample piece 9 in the Z direction. The analysis portion 9a is a region to be analyzed, and a width of the analysis portion 9a is smaller than a width of the sample piece 9 around the analysis portion 9a in the Y direction.

The tweezers 8 include a pair of gripping members 8a1 and 8a2, and the sample piece 9 is gripped between the gripping members 8a1 and 8a2. More specifically, the gripping member 8a1 has a gripping region 8c1 and an abutment region 8b1 integrated with the gripping region 8c1, and the gripping member 8a2 has a gripping region 8c2 and an abutment region 8b2 integrated with the gripping region 8c2. The gripping members 8a1 and 8a2 are made of, for example, a semiconductor material such as silicon.

The gripping region 8c1 includes a gripping surface SF1 for gripping the sample piece, and the gripping region 8c2 includes a gripping surface SF2 that faces the gripping surface SF1 and is for gripping the sample piece 9. The sample piece 9 is held between the gripping surface SF1 and the gripping surface SF2.

The abutment region 8b1 includes an opposing surface SF3 and an abutment surface SF5. The abutment surface SF5 is a surface that connects the opposing surface SF3 and the gripping surface SF1. The abutment region 8b2 includes an opposing surface SF4 and an abutment surface SF6. The opposing surface SF4 faces the opposing surface SF3, and is a surface closer to the gripping member 8a1 than the gripping surface SF2. The abutment surface SF6 is a surface that connects the opposing surface SF4 and the gripping surface SF2.

The abutment region 8b1 protrudes from the gripping region 8c1 in a direction directed from the gripping surface SF1 toward the gripping surface SF2. The abutment region 8b2 protrudes from the gripping region 8c2 in a direction directed from the gripping surface SF2 toward the gripping surface SF1.

In other words, the abutment region 8b1 protrudes from the gripping region 8c1 such that the opposing surface SF3 is closer to the gripping member 8a2 than the gripping surface SF1, and the abutment region 8b2 protrudes from the gripping region 8c2 such that the opposing surface SF4 is closer to the gripping member 8a1 than the gripping surface SF2. In other words, a distance between the opposing surface SF3 and the opposing surface SF4 is smaller than a distance between the gripping surface SF1 and the gripping surface SF2.

When the sample piece 9 is gripped between the gripping surface SF1 and the gripping surface SF2, the opposing surface SF3 and the opposing surface SF4 are not in contact with each other, and are separated from each other with a certain gap therebetween. If the opposing surface SF3 and the opposing surface SF4 come into contact with each other first, the sample piece 9 cannot be gripped. In the first embodiment, since the distance between the opposing surface SF3 and the opposing surface SF4 is designed as described above, the sample piece 9 is stably gripped between the gripping member 8a1 and the gripping member 8a2.

As will be described in detail later, in a state where the sample piece 9 is gripped between the gripping surface SF1 and the gripping surface SF2, a position of the sample piece 9 may deviate or the sample piece 9 may be rotated. That is, although a state of the sample piece 9 may change, since the abutment region 8b1 and the abutment region 8b2 exist in the first embodiment, the sample piece 9 is pressed against the abutment region 8b1 (abutment surface SF5) and the abutment region 8b2 (abutment surface SF6), whereby the position of the sample piece 9 can be corrected to a normal position.

As shown in FIGS. 2 and 4, the gripping member 8a1 (the gripping region 8c1 and the abutment region 8b1) and the gripping member 8a2 (the gripping region 8c2 and the abutment region 8b2) extend in predetermined directions, but the abutment surface SF5 and the abutment surface SF6 are inclined with respect to these extending directions. In other words, the abutment surface SF5 and the abutment surface SF6 are inclined with respect to surfaces perpendicular to the extending directions.

Even if the abutment surface SF5 and the abutment surface SF6 are the surfaces perpendicular to the extending directions, as described above, the sample piece 9 can be stably gripped, and the position of the sample piece 9 can be corrected to a normal position. Although not particularly shown, such a structure is also included in the first embodiment.

However, as described above, since the abutment surface SF5 and the abutment surface SF6 are inclined, a contact area between the gripping surface SF1 and the sample piece 9 and a contact area between the gripping surface SF2 and the sample piece 9 can be increased. Therefore, since a gripping force of the sample piece 9 is increased, the sample piece 9 can be gripped more stably.

When the sample piece 9 is pressed against the abutment region 8b1 (abutment surface SF5) and the abutment region 8b2 (abutment surface SF6), since the abutment surface SF5 and the abutment surface SF6 are inclined, a contact area between the abutment surface SF5 and the sample piece 9 and a contact area between the abutment surface SF6 and the sample piece 9 can be increased. Therefore, it is easier to correct the position of the sample piece 9 to a normal position.

<Processing Flow of Conveyance Method>

Hereinafter, a method for conveying the sample piece 9 according to the first embodiment will be described while comparing steps S1 to S13 shown in a flowchart of FIG. 5 with FIGS. 9 to 17. Further, various functions such as a sample piece obtaining function and a sample piece mounting function provided in the conveyance device 1 will also be described.

<<Structure of Carrier 10>>

A structure of the carrier 10 according to the first embodiment will be described with reference to FIGS. 6 to 8 before describing steps S1 to S13.

As shown in FIG. 6, the carrier 10 includes a half-moon type base 11 and a plurality of support portions (gap portions) 12 that protrude from a surface of the base 11 in the Z direction, and the sample piece 9 is mounted on the plurality of support portions 12 of the carrier 10. The base 11 including the plurality of support portions 12 may be formed of, for example, one material such as silicon, but a location of the base 11 where the plurality of support portions 12 are provided and a periphery thereof may be formed of a material different from the material that forms the base 11. For example, a large portion of the base 11 may be formed of copper, and the plurality of support portions 12 and a periphery thereof may be formed of silicon.

As shown in FIG. 7, the support portion 12 is configured with a support column 12a and a support column 12b, and the support column 12a and the support column 12b protrude from a placement surface 11a of the base 11 in the Z direction and extend in the Z direction. Further, the support column 12a and the support column 12b are separated from each other in the Y direction.

The sample piece 9 is supported by the support portion 12 that forms a gap portion. Specifically, the sample piece 9 is sandwiched between the support column 12a and the support column 12b, and the lower end portion 9c of the sample piece 9 is placed on the placement surface 11a. Here, one sample piece 9 is supported by the support portion 12, but a plurality of sample pieces 9 may be supported by the support portion 12 by increasing heights of the support column 12a and the support column 12b.

On one carrier 10, 4 to 20 support portions 12 each including such support column 12a and support column 12b are provided. A case where the support column 12a and the support column 12b are quadrangular prism bodies is exemplified in the first embodiment, but a shape of support columns 12a to 12d may be a non-rectangular polygonal prism body or a columnar body as long as the shape can hold the sample piece 9.

As shown in FIG. 8, the support portion 12 may be configured with the support columns 12a to 12d. When a holding force of the sample piece 9 of the carrier 10 as shown in FIG. 7 is insufficient, it is effective to use the carrier 10 as shown in FIG. 8.

In FIG. 8, the support column 12a and the support column 12b are separated from each other in the Y direction, and the support column 12c and the support column 12d are separated from each other in the Y direction. Further, the support column 12a and the support column 12b are separated from the support column 12c and the support column 12d in the X direction. The sample piece 9 is sandwiched between the support column 12a and the support column 12b, and between the support column 12c and the support column 12d.

The plurality of sample pieces 9 obtained from the sample 90 are sequentially mounted on the carrier 10. Further, when the sample piece 9 is analyzed, the analysis is performed in a state where the plurality of sample pieces 9 are mounted on the carrier 10. Therefore, in a plan view viewed from the Y direction, the analysis portion 9a does not overlap the support portion 12 and is exposed from the support portion 12 such that the analysis portion 9a is not blocked by the support portion 12.

<<Sample Piece Obtaining Function>>

The sample piece obtaining function is a function for taking out the sample piece 9 from a part of the sample 90 by using the tweezers 8 when the sample 90 is placed on the stage 5.

In step S1, the sample piece 9 is moved to an imaging region. First, as shown in FIG. 9, the sample 90 in which the sample piece 9 is produced on a part thereof is placed on the stage 5. The sample piece 9 is produced by the FIB device or the like before the sample 90 is transferred to the conveyance device 1. Further, the sample piece 9 is bonded to the sample 90 by a bonding portion 9d that is a part of the sample 90.

The number of such bonding portions 9d is not limited to one, and a plurality of such bonding portions 9d may be formed. Further, in FIG. 9, the sample piece 9 includes the analysis portion 9a, but the analysis portion 9a may be produced using the ion beam column 3 inside the conveyance device 1 after the sample piece 9 is mounted on the carrier 10.

Next, the sample piece 9 is moved to the imaging region by moving the stage 5 by the stage control unit C3.

Through the entire conveyance method described below, a SEM image having a top-view by the electron beam column 2 or a SIM image having a tilt-view by the ion beam column 3 is obtained. The top-view mainly checks a state of the tweezers 8, the sample piece 9, or the carrier 10 in a lateral direction, such as the Y direction in FIG. 7. The tilt-view mainly checks a state of the tweezers 8, the sample piece 9, or the carrier 10 in a height direction, such as the Z direction in FIG. 7. Hereinafter, a case where an observation is performed mainly by the SEM image by the electron beam column 2 will be exemplified.

In step S2, a position of the sample piece 9 is checked. The electron beam column control unit C1 focuses the electron beam column 2, which is the imaging medium, on the sample piece 9 to obtain rough position information of the sample piece 9.

In step S3, the tweezers 8 are moved. The tweezers control unit C5 drives the manipulator 7 to move the tweezers 8 to a substantial center of an imaging region.

In step S4, a position of the tweezers 8 is checked. The electron beam column control unit C1 focuses the electron beam column 2, which is an imaging medium, on the tweezers 8 to obtain rough position information of the tweezers 8.

In step S5, the tweezers 8 are moved directly above the sample piece 9. Based on the rough position information of the sample piece 9 obtained in step S2 and the rough position information of the tweezers 8 obtained in step S4, the stage control unit C3 or the tweezers control unit C5 moves the stage 5 or the manipulator 7 such that the tweezers 8 are positioned directly above the sample piece 9.

In step S6, the tweezers 8 are brought close to the sample piece 9. The tweezers 8 are brought close to the sample piece 9 by the stage control unit C3 or the tweezers control unit C5 moving the stage 5 or the manipulator 7. FIG. 10 shows a state where the tweezers 8 are lowered in a state where the gripping member 8a1 and the gripping member 8a2 of the tweezers 8 are opened.

In step S7, the sample piece 9 is gripped by the tweezers 8. As shown in FIG. 11, the sample piece 9 is gripped between the gripping member 8a1 and the gripping member 8a2 by the tweezers control unit C5 closing the tweezers 8. Here, the position of the tweezers 8 is adjusted such that the gripping surface SF1 and the gripping surface SF2 are in contact with the sample piece 9 while the upper end portion 9b of the sample piece 9 is separated from the abutment region 8b1 and the abutment region 8b2 (first state).

Since the analysis portion 9a has a concave shape with respect to a periphery thereof, even if the tweezers 8 and the sample piece 9 slide, the analysis portion 9a is not damaged. Further, the tweezers 8 may grip the sample piece 9 such that the analysis portion 9a is covered. Accordingly, contamination of the analysis portion 9a is reduced.

In step S8, the sample piece 9 is cut from the sample 90. Here, the sample piece 9 is taken out from the sample 90 in a state where the sample piece 9 is gripped by the tweezers 8.

As an example for taking out the sample piece 9, a method for breaking the bonding portion 9d by sputtering using the ion beam column 3 is exemplified. In a case where the method is used, when the tweezers 8 grip the sample piece 9 in step S7, it is necessary to grip the sample piece 9 from a direction in which the bonding portion 9d is not covered by the tweezers 8.

As shown in FIG. 12, when breaking the bonding portion 9d, the stage control unit C3 or the tweezers control unit C5 moves the stage 5 or the manipulator 7 to bring the tweezers 8 close to the sample piece 9. The upper end portion 9b of the sample piece 9 comes into contact with the tweezers 8 by moving the tweezers 8 in a direction directed from the upper end portion 9b to the lower end portion 9c.

In this case, first, the sample piece 9 slides between the gripping surface SF1 and the gripping surface SF2, and the upper end portion 9b of the sample piece 9 comes into contact with a part of each of the abutment region 8b1 and the abutment region 8b2. Thereafter, the entire upper end portion 9b of the sample piece 9 comes into surface contact with the abutment region 8b1 and the abutment region 8b2 (second state) by further moving the tweezers 8 in the direction directed from the upper end portion 9b to the lower end portion 9c.

That is, the upper end portion 9b in the second state as shown in FIG. 12 comes into contact with the abutment region 8b1 and the abutment region 8b2 such that a contact area is larger than that in the first state as shown in FIG. 11.

In the second state, since the sample piece 9 is pressed from three directions including the gripping surface SF1, the gripping surface SF2, and the abutment region 8b1 and the abutment region 8b2, a rotation action of the sample piece 9 due to an external force is reduced. That is, since stability of gripping the sample piece 9 is high, a defect such as deviation of a position of the analysis portion 9a of the sample piece 9 is unlikely to occur.

FIG. 13 shows another example for taking out the sample piece 9. In the state where the upper end portion 9b comes into contact with the abutment region 8b1 and the abutment region 8b2 as shown in FIG. 12 (second state), the tweezers 8 are further moved in the direction directed from the upper end portion 9b to the lower end portion 9c, the bonding portion 9d is broken, so that the sample piece 9 is separated from the sample 90. By this method, the sample piece 9 can also be obtained from the sample 90. Since it is not necessary to perform sputtering in this method, a conveyance step of the sample piece 9 can be simplified.

<<Deviation or Rotation of Sample Piece 9>>

FIG. 14 shows a case where the sample piece 9 deviates or rotates in a state where the sample piece 9 is gripped between the gripping member 8a1 and the gripping member 8a2 (between the gripping surface SF1 and the gripping surface SF2). When the sample piece 9 is mounted on the carrier 10 in this state, since a state is formed in which a position of the analysis portion 9a deviates from a normal position, an enormous amount of time is required for work of searching for the position of the analysis portion 9a and identifying to what an extent the analysis portion 9a deviates.

For example, when the upper end portion 9b is separated from the abutment region 8b1 and the abutment region 8b2 as shown in FIG. 11, the deviation or the rotation of the sample piece 9 as shown in FIG. 14 is likely to occur. However, as shown in FIG. 17 described later, when the sample piece 9 is mounted on the carrier 10, the upper end portion 9b comes into contact with the abutment region 8b1 and the abutment region 8b2 while the sample piece 9 slides between the gripping surface SF1 and the gripping surface SF2. Therefore, the position of the analysis portion 9a is returned to a normal position. Therefore, since a time for searching for the analysis portion 9a can be shortened, a throughput in the entire analysis step can be improved.

Here, as shown in FIG. 12, the upper end portion 9b is brought into contact with the abutment region 8b1 and the abutment region 8b2 in advance (second state), even if the sample piece 9 is mounted on the carrier 10 in this state, since the position of the analysis portion 9a is at a normal position, the time for searching for the analysis portion 9a can be shortened.

However, even in a state where the sample piece 9 is gripped by the tweezers 8 as shown in FIG. 12, during a period in which the sample piece 9 is conveyed from the sample 90 to the carrier 10 or a period in which the sample piece 9 is inserted into the carrier 10, the deviation or the rotation of the sample piece 9 may occur. For example, the upper end portion 9b may be changed from a state of being in contact with the entire abutment region 8b1 and the entire abutment region 8b2 to a state of being in contact with only a part of the abutment region 8b1 and the abutment region 8b2. Even in that case, as shown in FIG. 17 described later, the position of the analysis portion 9a is returned to a normal position.

In this way, in the first embodiment, the sample piece 9 gripped between the gripping member 8a1 and the gripping member 8a2 (between the gripping surface SF1 and the gripping surface SF2) is changed from the first state to the second state.

To summarize the above description, the first state is a state where the upper end portion 9b is separated from the abutment region 8b1 and the abutment region 8b2, or a state where the upper end portion 9b is in contact with a part of each of the abutment region 8b1 and the abutment region 8b2.

The second state is a state where the upper end portion 9b is in contact with the abutment region 8b1 and the abutment region 8b2 such that the contact area is larger than that in the first state. That is, the position of the analysis portion 9a is in a normal state. In other words, the state of the sample piece 9 is changed such that the upper end portion 9b and the lower end portion 9c in the second state are closer to being parallel to the placement surface 11a of the carrier 10 than the upper end portion 9b and the lower end portion 9c in the first state.

<<Sample Piece Mounting Function>>

The sample piece mounting function is a function for mounting the obtained sample piece 9 on the carrier 10. In a state where the sample piece 9 is gripped by the tweezers 8 after the sample piece 9 is obtained, the sample piece 9 is mounted on the carrier 10.

In step S9, the tweezers 8 are moved. The tweezers 8 that grip the sample piece 9 are moved directly above the carrier 10 by the stage control unit C3 or the tweezers control unit C5 moving the stage 5 or the manipulator 7. Here, a case where the upper end portion 9b is separated from the abutment region 8b1 and the abutment region 8b2 as shown in FIG. 11 is exemplified (first state).

In step S10, an alignment adjustment between the tweezers 8 and the carrier 10 is performed. As shown in FIG. 15, the stage control unit C3 or the tweezers control unit C5 performs a position adjustment of the stage 5 or the manipulator 7 such that the sample piece 9 is housed in the support portion 12 (between the support column 12a and the support column 12b) of the carrier 10.

In step S11, the sample piece 9 is mounted on the carrier 10. The sample piece 9 gripped by the tweezers 8 is brought close to the carrier 10 by the stage control unit C3 or the tweezers control unit C5 moving the stage 5 or the manipulator 7. As shown in FIG. 16, the sample piece 9 is inserted between the support column 12a and the support column 12b of the carrier 10.

In FIG. 16, the sample piece 9 is inserted from upper portions of the support column 12a and the support column 12b, and the sample piece 9 may be inserted from side surface portions of the support column 12a and the support column 12b.

Next, as shown in FIG. 17, the upper end portion 9b of the sample piece 9 comes into contact with the tweezers 8 by moving the tweezers 8 in the direction directed from the upper end portion 9b to the lower end portion 9c.

In this case, first, the sample piece 9 slides between the gripping surface SF1 and the gripping surface SF2, and the upper end portion 9b of the sample piece 9 comes into contact with a part of each of the abutment region 8b1 and the abutment region 8b2. Thereafter, the entire upper end portion 9b of the sample piece 9 comes into surface contact with the abutment region 8b1 and the abutment region 8b2 (second state) by further moving the tweezers 8 in the direction directed from the upper end portion 9b to the lower end portion 9c.

That is, the upper end portion 9b in the second state as shown in FIG. 17 comes into contact with the abutment region 8b1 and the abutment region 8b2 such that a contact area is larger than that in the first state as shown in FIG. 16. The lower end portion 9c is placed on the placement surface 11a such that the lower end portion 9c is in contact with the placement surface 11a of the carrier 10.

In this way, even if the sample piece 9 is inserted, a state of the sample piece 9 is changed from the first state to the second state. That is, during a period from a starting time of step S8 in which the sample piece 9 is taken out to an ending time of step S11 in which the sample piece 9 is mounted on the carrier 10, a state of the sample piece 9 gripped between the gripping member 8a1 and the gripping member 8a2 is changed from the first state to the second state.

Although the deviation or the rotation of the sample piece 9 may occur during the insertion of the sample piece 9, since the sample piece 9 is eventually in the second state, the position of the analysis portion 9a is returned to a normal position. Therefore, since the time for searching for the analysis portion 9a can be shortened, the throughput in the entire analysis step can be improved.

The lower end portion 9c may not necessarily be in contact with the placement surface 11a of the carrier 10. For example, when taking out the sample piece 9, if the sample piece 9 is gripped by the tweezers 8 in the second state as shown in FIG. 12, the sample piece 9 is inserted between the support column 12a and the support column 12b in a state where the upper end portion 9b and the lower end portion 9c in the second state are parallel to the placement surface 11a. In this case, the lower end portion 9c is not in contact with the placement surface 11a, and the sample piece 9 is held between the support column 12a and the support column 12b.

In step S12, the tweezers 8 are opened and retracted. First, the tweezers control unit C5 drives the manipulator 7, and the gripping surface SF1 and the gripping surface SF2 of the tweezers 8 are separated from the sample piece 9. Next, the tweezers 8 are retracted from the imaging region by the stage control unit C3 or the tweezers control unit C5 moving the stage 5 or the manipulator 7.

In step S13, a mounting position of the sample piece 9 is checked. The detector control unit C4 obtains the SEM image by the electron beam column 2 or the SIM image by the ion beam column 3, and checks a mounting state of the sample piece 9. Thereafter, the carrier 10 mounted with the sample piece 9 is transferred from the conveyance device 1 to the analysis device (charged particle beam device) such as the SEM, the STEM, or the TEM, and the analysis portion 9a of the sample piece 9 is analyzed in the charged particle beam device.

(First Modification and Second Modification)

FIGS. 18 and 19 show tweezers according to a first modification and a second modification of the first embodiment. The first modification and the second modification are different from the first embodiment in shapes of the opposing surface SF3 and the opposing surface SF4.

In the first modification and the second modification, the opposing surface SF3 and the opposing surface SF4 have a concave portion and a convex portion, respectively. Only one concave portion and convex portion may be formed, or a plurality of concave portions and convex portions may be formed. The opposing surface SF3 and the opposing surface SF4 face each other such that a concave portion of the opposing surface SF3 is fitted to a convex portion of the opposing surface SF4 and a convex portion of the opposing surface SF3 is fitted to a concave portion of the opposing surface SF4. As described above, when the sample piece 9 is gripped between the gripping surface SF1 and the gripping surface SF2, the opposing surface SF3 and the opposing surface SF4 are slightly separated from each other and do not come into contact with each other.

Regarding the concave portion and the convex portion of each of the opposing surface SF3 and the opposing surface SF4, various shapes can be applied, such as a shape in a parallel direction, a perpendicular direction, or an intersecting direction with respect to an extending direction of the gripping member 8a1 (the gripping region 8c1 and the abutment region 8b1) and the gripping member 8a2 (the gripping region 8c2 and the abutment region 8b2). Further, the concave portion and the convex portion may have a wedge shape, a quadrangular prism shape, a pyramid shape, or the like. Further, locations where the concave portion and the convex portion are formed are not only locations close to the gripping region 8c1 and the gripping region 8c2 of the abutment region 8b1 and the abutment region 8b2, but also may be provided at any locations of the abutment region 8b1 and the abutment region 8b2.

Since such a concave portion and such a convex portion are provided, when gripping the sample piece 9, the gripping member 8a1 and the gripping member 8a2 are unlikely to intersect with each other when the gripping member 8a1 and the gripping member 8a2 are brought close to each other. Therefore, the stability of gripping the sample piece 9 can be further improved.

Although the present invention has been specifically described based on the above embodiment, the present invention is not limited to the above embodiment, and various modifications can be made without departing from the gist of the present invention.

For example, the imaging medium in the above embodiment has been described as the electron beam column 2 or the ion beam column 3, but the imaging medium may be an optical microscope or the like as long as the imaging medium can image the sample piece 9.

The sample 90 and the sample piece 9 in the above embodiment have been mainly described as semiconductor devices such as semiconductor substrates, semiconductor elements, and wiring layers, but the sample 90 and the sample piece 9 may be devices in other fields other than the semiconductor devices.

Some or all steps such as steps S1 to S13 may be performed by the user, or may be performed by artificial intelligence provided in the comprehensive control unit C0.

REFERENCE SIGNS LIST 1 conveyance device
2 electron beam column
3 ion beam column
4 sample chamber
5 stage
6 detector
7 manipulator
8 tweezers
8a1, 8a2 gripping member
8b1, 8b2 abutment region
8c1, 8c2 gripping region
9 sample piece (thin film sample, lamellar)
9a analysis portion
9b upper end portion
9c lower end portion
9d bonding portion
10 carrier (grid, mesh)
11 base
11a placement surface
12 support portion
12a to 12d support column
50 input device
51 display
90 sample (wafer)
C0 comprehensive control unit
C1 electron beam column control unit
C2 ion beam column control unit
C3 stage control unit
C4 detector control unit
C5 tweezers control unit
EB electron beam
IB ion beam
OA1, OA2 optical axis
S1 to S13 step
SF1, SF2 gripping surface
SF3, SF4 facing surface
SF5, SF6 abutment surface

The invention claimed is:

1. Tweezers configured to clamp a sample piece to be analyzed using a charged particle beam device, the tweezers comprising:
a first clamping member; and
a second clamping member, wherein
the first clamping member includes a first clamping region where the sample piece slides in a clamped state, and a first abutment region which is integrated with the first clamping region and against which the sliding sample piece abuts,
the second clamping member includes a second clamping region where the sample piece slides in a clamped state, and a second abutment region which is integrated with the second clamping region and against which the sliding sample piece abuts,
the first clamping region includes a first surface for clamping the sample piece,
the second clamping region includes a second surface that faces the first surface and is for clamping the sample piece,
the first abutment region protrudes from the first clamping region in a direction directed from the first surface to the second surface, and
the second abutment region protrudes from the second clamping region in a direction directed from the second surface to the first surface.

2. A conveyance device including the tweezers according to claim 1, the conveyance device comprising:
a stage for placing a sample;
a carrier for mounting the sample piece;
a sample piece obtaining function for taking out the sample piece from a part of the sample by using the tweezers when the sample is placed on the stage; and
a sample piece mounting function for mounting the sample piece clamped by the tweezers on the carrier.

3. The conveyance device according to claim 2, further comprising:
a manipulator connected to the tweezers; and
a control unit configured to control the manipulator,
wherein the tweezers are operated and moved by the manipulator based on a control signal from the control unit.

4. The conveyance device according to claim 2, further comprising:
an imaging medium configured to observe a clamping state of the sample piece by the tweezers.

5. The conveyance device according to claim 4, further comprising:
an electron beam column configured to emit an electron beam or an ion beam column configured to emit an ion beam; and
a detector configured to detect a secondary electron emitted from an observation target to which the electron beam or the ion beam is emitted,
wherein the imaging medium includes the electron beam column or the ion beam column, and the detector.

6. Tweezers configured to clamp a sample piece to be analyzed using a charged particle beam device, the tweezers comprising:
a first clamping member; and
a second clamping member, wherein
the first clamping member includes a first clamping region and a first abutment region integrated with the first clamping region,
the second clamping member includes a second clamping region and a second abutment region integrated with the second clamping region,
the first clamping region includes a first surface for clamping the sample piece,
the second clamping region includes a second surface that faces the first surface and is for clamping the sample piece,
the first abutment region protrudes from the first clamping region in a direction directed from the first surface to the second surface,
the second abutment region protrudes from the second clamping region in a direction directed from the second surface to the first surface,
the first abutment region includes a third surface closer to the second clamping member than the first surface,
the second abutment region includes a fourth surface that faces the third surface and is closer to the first clamping member than the second surface,
the third surface and the fourth surface include a concave portion and a convex portion, respectively, and
the third surface and the fourth surface face each other such that a concave portion of the third surface is fitted to a convex portion of the fourth surface and a convex portion of the third surface is fitted to a concave portion of the fourth surface.

7. Tweezers configured to clamp a sample piece to be analyzed using a charged particle beam device, the tweezers comprising:

a first clamping member; and a second clamping member, wherein the first clamping member includes a first clamping region and a first abutment region integrated with the first clamping region, the second clamping member includes a second clamping region and a second abutment region integrated with the second clamping region, the first clamping region includes a first surface for clamping the sample piece, the second clamping region includes a second surface that faces the first surface and is for clamping the sample piece, the first abutment region protrudes from the first clamping region in a direction directed from the first surface to the second surface, the second abutment region protrudes from the second clamping region in a direction directed from the second surface to the first surface, the first abutment region includes a third surface closer to the second clamping member than the first surface, and a fifth surface that connects the third surface and the first surface, the second abutment region includes a fourth surface that faces the third surface and is closer to the first clamping member than the second surface, and a sixth surface that connects the fourth surface and the second surface, the first clamping region, the first abutment region, the second clamping region, and the second abutment region extend in a first direction, and the fifth surface and the sixth surface are inclined with respect to a surface perpendicular to the first direction.

8. A method for conveying a sample piece performed using a conveyance device including a stage for placing a sample, and tweezers including a first clamping member and a second clamping member, the method for conveying a sample piece comprising:

(a) a step of placing the sample from which the sample piece is produced on a part of the stage;

(b) a step of clamping the sample piece between the first clamping member and the second clamping member after the step (a);

(c) a step of taking out the sample piece from the sample in a state where the sample piece is clamped by the tweezers after the step (b); and (d) a step of mounting the sample piece on a carrier for mounting the sample piece to be analyzed using a charged particle beam device in a state where the sample piece is clamped by the tweezers after the step (c), wherein during a period from a starting time of the step (c) to an ending time of the step (d), a state of the sample piece clamped between the first clamping member and the second clamping member changes from a first state to a second state because of sliding between the sample piece and the and second clamping members.

9. The method for conveying a sample piece according to claim 8, wherein the sample piece includes a lower end portion and an upper end portion on a side opposite to the lower end portion, the lower end portion is positioned closer to a placement surface of the carrier than the upper end portion when the sample piece is mounted on the carrier, and the upper end portion in the second state is closer to being parallel to the placement surface than the upper end portion in the first state.

10. A method for conveying a sample piece performed using a conveyance device including a stage for placing a sample, and tweezers including a first clamping member and a second clamping member, the method for conveying a sample piece comprising:

(a) a step of placing the sample from which the sample piece is produced on a part of the stage;

(b) a step of clamping the sample piece between the first clamping member and the second clamping member after the step (a);

(c) a step of taking out the sample piece from the sample in a state where the sample piece is clamped by the tweezers after the step (b); and (d) a step of mounting the sample piece on a carrier for mounting the sample piece to be analyzed using a charged particle beam device in a state where the sample piece is clamped by the tweezers after the step (c), wherein during a period from a starting time of the step (c) to an ending time of the step (d), a state of the sample piece clamped between the first clamping member and the second clamping member changes from a first state to a second state, the first clamping member includes a first clamping region and a first abutment region integrated with the first clamping region, the second clamping member includes a second clamping region and a second abutment region integrated with the second clamping region, the first clamping region includes a first surface for clamping the sample piece, the second clamping region includes a second surface that faces the first surface and is for clamping the sample piece, the first abutment region protrudes from the first clamping region in a direction directed from the first surface to the second surface, the second abutment region protrudes from the second clamping region in a direction directed from the second surface to the first surface, the sample piece includes a lower end portion and an upper end portion on a side opposite to the lower end portion, the lower end portion is positioned closer to a placement surface of the carrier than the upper end portion when the sample piece is mounted on the carrier, the upper end portion in the first state is separated from the first abutment region and the second abutment region, or is in contact with a part of each of the first abutment region and the second abutment region, and the upper end portion in the second state is in contact with the first abutment region and the second abutment region such that a contact area is larger than that in the first state.

11. The method for conveying a sample piece according to claim 10, wherein a change from the first state to the second state is performed while the sample piece slides between the first surface and the second surface.

12. The method for conveying a sample piece according to claim 11, wherein
the change from the first state to the second state is performed by moving the tweezers in a direction directed from the upper end portion to the lower end portion in the step (c).

13. The method for conveying a sample piece according to claim 12, wherein
the sample piece is taken out by further moving the tweezers in a direction directed from the upper end portion to the lower end portion to separate the sample piece from the sample in the second state.

14. The method for conveying a sample piece according to claim 11, wherein
the change from the first state to the second state is performed by moving the tweezers in a direction directed from the upper end portion to the lower end portion in the step (d).

* * * * *